United States Patent [19]

Yukawa

[11] 4,408,349
[45] Oct. 4, 1983

[54] RECEIVER PROVIDED WITH A FREQUENCY SYNTHESIZER CAPABLE OF STORING FINE TUNING INFORMATION

[75] Inventor: Tatsuo Yukawa, Tokyo, Japan

[73] Assignee: Nippon Electric Co., Ltd., Tokyo, Japan

[21] Appl. No.: 283,858

[22] Filed: Jul. 16, 1981

[30] Foreign Application Priority Data

Jul. 22, 1980 [JP] Japan .......................... 55/103442[U]

[51] Int. Cl.³ .............................................. H04B 1/16
[52] U.S. Cl. .................................... 455/182; 455/183; 455/186
[58] Field of Search ............... 455/164, 165, 182, 183, 455/185, 186, 192

[56] References Cited

U.S. PATENT DOCUMENTS 4,121,162 10/1978 Alberkrack et al. ................. 455/182
4,123,724 10/1978 Das et al. .............................. 455/183
4,280,140 7/1981 Skerlos ................................. 455/182
4,298,989 11/1981 Someno et al. ...................... 455/182

FOREIGN PATENT DOCUMENTS 55-23674 2/1980 Japan ................................... 455/192

OTHER PUBLICATIONS

"A Microcomputer Controlled Frequency Synthesizer for TV" by Rzeszewski et al., 2/18/78.

Primary Examiner—Jin F. Ng
Attorney, Agent, or Firm—Sughrue, Mion, Zinn, Macpeak and Seas

[57] ABSTRACT

A channel selector in a receiver such as a television receiver is provided with a key board input for channel selection and automatic and manual fine tuning. A read only memory stores frequency division ratio data for each selectable channel and reads out this data when a channel is selected. In the case where there is a large offset between the nominal broadcasting frequency and the actual broadcasting frequency, it will be necessary to modify the division ratio data by means of the manual tuning keys. A RAM stores the manual tuning information input via the keys so that manual tuning need be effected only once. Upon re-selection of the same channel, tuning of the previously manually set position is automatically effected.

9 Claims, 3 Drawing Figures

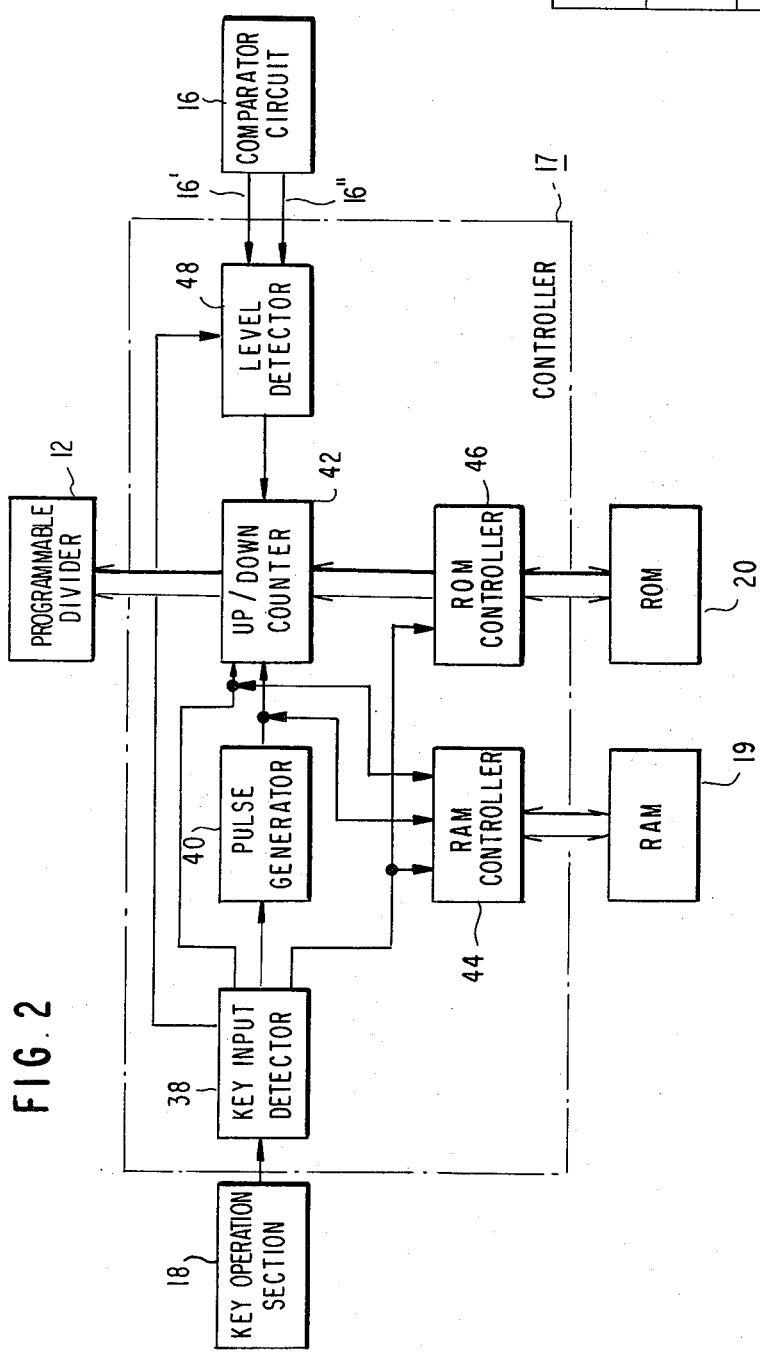

RECEIVER PROVIDED WITH A FREQUENCY SYNTHESIZER CAPABLE OF STORING FINE TUNING INFORMATION

BACKGROUND OF THE INVENTION

The present invention relates to a channel selector in a receiver such as in radio and television receivers, and more particularly to a PLL (Phase Locked Loop) frequency synthesizer type channel selector that is available in television receiver.

In a PLL frequency synthesizer type channel selector, an oscillation frequency of a local oscillator is controlled according to the PLL technique. More particularly, an oscillation output from a local oscillator is applied to a programmable frequency-divider and is divided in frequency according to frequency-division ratio data which are set in the programmable frequency-divider. The frequency-divided output is applied to one input of a phase detector. The phase detector detects a phase difference between the frequency-divided output and an oscillation output from a reference oscillator which is applied to the other input of the phase detector. The detector output is fed to a low-pass filter, and the output of the low-pass filter is applied to the local oscillator as a control signal for controlling the oscillator frequency of the local oscillator. Owing to this phase synchronizing loop, the oscillation frequency of the local oscillator can be controlled so that the phases of the respective inputs to the phase detector may coincide with each other. Accordingly, a desired local oscillation frequency can be obtained by varying the frequency-division ratio data the programmable frequency-divider. This local oscillation frequency is mixed with the received frequency to derive an intermediate frequency signal, and a desired broadcasting channel can be received by demodulating the derived intermediate frequency signal. Accordingly, a receiver can be set so as to receive a transmission frequency from a desired broadcasting station by properly selecting the frequency-division ratio data. Therefore, in this type of channel selector, the channel selection operation is easy, and it is possible to realize stable operation free from deviation in synchronization.

On the other hand, however, in the event that the transmission frequency of the broadcasting station deviates from the regular frequency allotted to that station, in the above type of channel selector it is impossible to achieve optimum tuning because the local oscillation frequency is derived according to preset frequency-division ratio data. In other words, since the frequency-division data are preset and stored in a channel selector so that the local oscillation frequency corresponding to the regular frequency alloted to the desired broadcasting station may be derived, if the transmission frequency deviates from the regular frequency, then the intermediate frequency obtained by mixing the transmission frequency with the local oscillation frequency also deviates. As a result, optimum tuning becomes impossible.

Accordingly, in order to achieve optimum tuning, the local oscillation frequency must be controlled in dependence upon the transmission frequency. If the deviation of the transmission frequency from the regular frequency (hereinafter called "offset") is small, then the receiver can be automatically adjusted to the optimum tuning point by additionally providing an AFT (Automatic Fine Tuning) circuit. This AFT circuit acts to vary the frequency-division ratio data so that the received intensity of the transmission signal may be maximized, and to thereby compensate the offset, that is, the deviation of the received transmission signal from the regular frequency. In other words, if there exists any frequency deviation in the transmission frequency, then the intermediate frequency derived by mixing the received transmission frequency with the local oscillation would deviate from the regular intermediate frequency by a corresponding amount. Accordingly, if the derived intermediate frequency signal is detected by an FM-detector, the detector output would be at a voltage corresponding to the frequency deviation. Therefore, the local oscillation frequency is varied by varying the frequency-division ratio data so that the output voltage of the FM-detector may be reduced to zero. As a result, the local oscillation frequency is made to correspond to the transmission frequency having the frequency deviation, and thereby optimum tuning can be achieved.

Here it is to be noted that when the frequency deviation is large, even with the fine tuning operation achieved by the AFT circuit, the receiving frequency of the receiver cannot be tuned to the deviated transmission frequency. This is because the frequency range where fine tuning by means of the AFT circuit is possible, is determined by the so-called S-curve characteristics of an FM-detector. The frequency range where the detection relying upon the S-curve of an FM-detector is possible, is generally the range of $\pm 1$ MHz with respect to the center frequency. In other words, in the case where the transmission frequency from a broadcasting station has an offset of at most $\pm 1$ MHz, an FM-detector can generate a detector output corresponding to the magnitude of the offset, and hence the receiving frequency of the receiver can be tuned to the deviated transmission frequency through the AFT operation. However, among broadcasting stations there stations which transmit at a frequency having an offset of 1.3 MHz or more, especially in the case of cable TV broadcasting (hereinafter abbreviated as CATV) or like. Besides the CATV, VHF broadcasting which is transmitted through a cable also has a considerably large offset. When the transmission frequency has such a large offset, a detector output would not be obtained from the FM-detector, and as a result, tuning cannot be achieved through the fine tuning operation of the AFT circuit.

Therefore, as a provision for a transmission frequency having a large deviation from the regular frequency, the channel selector is equipped with a manual fine tuning function for varying the local oscillation frequency by externally varying the frequency-division ratio data in a forced manner. More particularly, the frequency-division ratio data can be forcibly varied by operating manual fine tuning keys provided in the channel selector. If the frequency-division ratio data are varied, then the local oscillation frequency is also varied by a corresponding amount. As a result, even in the event that a transmission frequency is received having such a large offset that fine tuning cannot be achieved by the AFT circuit, optimum tuning becomes possible.

However, the heretofore known channel selectors have had the following shortcoming. That is, assuming now that a TV viewer, for instance, has selected a particular channel, where the broadcasting station is transmitting at a frequency having a large offset, as is the case with CATV, then he can enjoy the TV program with the receiving condition optimized by operating the manual fine tuning keys in the above-described manner. Now let it be assumed that the TV viewer switched from the channel of that broadcasting station to another channel, and then again selected the previous channel. In response to the last channel selection, the frequency-division ratio data corresponding to the selected channel are set in the programmable frequency-divider, and hence a predetermined local oscillation frequency signal is generated. However, the transmission frequency of the re-selected channel has a large deviation from the regular frequency. Therefore, unless the manual fine tuning keys are again operated, the optimum receiving condition cannot be established. As described above, the channel selectors of the prior art were troublesome, in that when a channel for which manual fine tuning was once effected again selected, operation of the manual fine tuning keys had to be effected again. This troublesomeness was greatly enhanced when the channel selector was in the operation mode for receiving CATV.

SUMMARY OF THE INVENTION

It is therefore a principal object of the present invention to provide a channel selector which does not necessitate repeated manual fine tuning operations for the same channel.

Another object of the present invention is to provide a PLL frequency synthesizer type channel selector which has the capability of holding an optimum tuning condition realized by fine tuning.

The channel selector according to the present invention comprises a programmable frequency-divider in which frequency-division ratio data available for deriving a desired local oscillation frequency according to the PLL technique are set, and a controller responsive to external control signals for producing fine tuning data to vary the frequency-division ratio data, and varying the frequency-division ratio data according to the fine tuning data. The fine tuning data consists of up-/down data for indicating whether the frequency-division ratio data is to be increased or decreased, and quantitative data representing the quantity to be varied. The fine tuning data are stored in a memory device. If the channel for which fine tuning data were produced is again selected, the controller reads out the frequency-division ratio data corresponding to that channel which have been preliminarily stored in the memory device, and at the same time reads out the fine tuning data corresponding to that channel from the memory device. The controller varies the read frequency-division ratio data according to the contents of the read fine tuning data, that is, the up/down data and the quantitative data, and then sets the varied new frequency-division ratio data in the programmable frequency-divider.

Accordingly, the frequency-division ratio data derived as a result of the manual fine tuning operation carried out for a transmission frequency having a large frequency deviation, can be again set in the programmable frequency-divider without necessitating any further manual operation by the TV viewer, when the same channel has again been selected for reception. The local oscillation frequency derived according to the frequency-division ratio data is adapted to the offset of the transmission frequency, and hence the optimum tuning can be achieved. As a result, the manual fine tuning operation which has been necessitated each time a transmission frequency having a large offset is received in the prior art, becomes necessary only once, and accordingly, the troublesomeness in manual operation can be greatly reduced.

BRIEF DESCRIPTION OF THE DRAWINGS

Other objects, features and advantages of the present invention will become more apparent from the following detailed description of the invention taken in conjunction with the accompanying drawings, wherein:

FIG. 2 is a partial block diagram of the channel selector according to the present invention showing a more detailed construction of a controller illustrated in FIG. 1.

FIG. 3 is the key arrangement diagram of the key operation section illustrated in FIGS. 1 and 2.

DESCRIPTION OF THE PREFERRED EMBODIMENT

Figure 1:
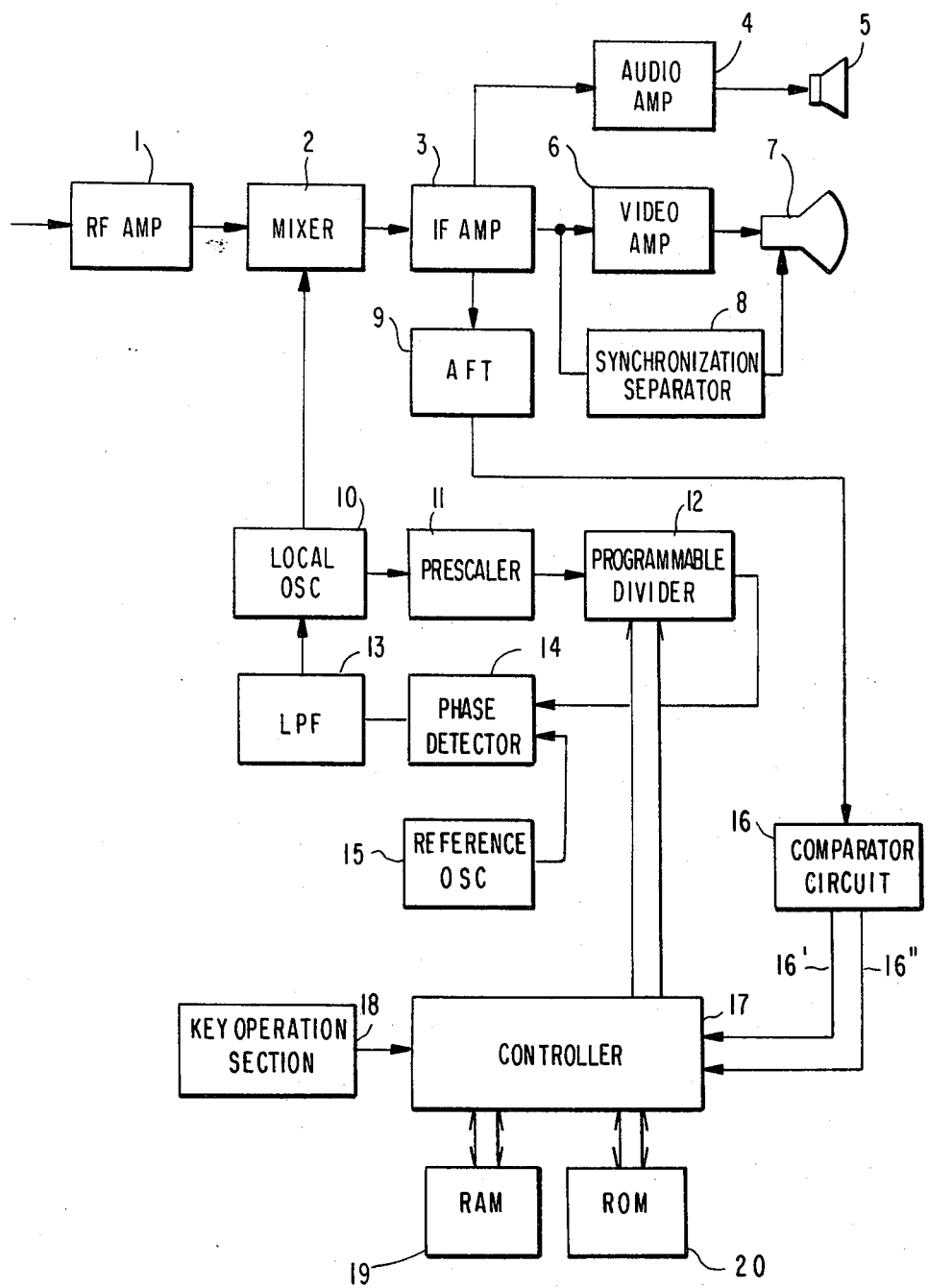
FIG. 1 is a block diagram of a channel selector according to the present invention as applied to a television receiver.

Referring now to FIG. 1, a channel selector according to the present invention as applied to a television receiver is illustrated in block form. A transmission frequency from a broadcasting station which has been received via an antenna or a cable is amplified by a radio frequency amplifier (RF AMP) 1 and then applied to a mixer 2. In the mixer 12, the output of the RF AMP 1 is mixed with local oscillation frequency of a local oscillator (Local OSC) 10 to output an intermediate frequency signal. This intermediate frequency signal is amplified by an intermediate frequency amplifier (IF AMP) 3. An audio signal passed through the IF AMP 3 is, after being subjected to FM-detection, amplified by an audio amplifier 4 and fed to a loudspeaker 5. A video signal fed from the IF AMP 3 is, after being subjected to video-detection, applied to a video amplifier 6 and a synchronization separator 8, and thereby a picture image can be displayed on a Braun tube 7.

The oscillation frequency of the local OSC 10 is controlled according to the PLL technique. More particularly, the oscillation output of the local OSC 10 is applied via a prescaler 11 to a programmable frequency-divider 12. The oscillation output fed to the programmable frequency-divider 12 is divided in frequency according to the frequency-division ratio data set therein, and is then applied to one input of a phase detector 14. To the other input of the phase detector 14 is applied an oscillation output of a reference oscillator (Reference OSC) 15. The phase detector 14 applies an output signal corresponding to phase difference between these two input signals to a load-pass filter (LPF) 13. The output of the LPF 13 is applied to the Local OSC 10 as a control signal for controlling its oscillation frequency. The local OSC 10 is a voltage-controlled oscillator whose oscillation frequency is controlled by the control signal fed from the LPF 13.

The prescaler 11 was interposed due to the fact that the programmable frequency-divider 12 is constructed of MOS (Metal Oxide Semiconductor) transistors. More particularly, in the programmable frequency-divider 12 having a MOS transistor construction, the operable frequencies are low, whereas the oscillation frequency of the Local OSC 10 is several MHz. Accordingly, by means of the prescaler 11, the input frequency of the programmable frequency-divider 12 is lowered to a frequency at which the programmable frequency-divider 12 is operable. The prescaler 11 is, for example, a frequency-divider having fixed frequency-dividing stages each consisting of an ECL (Emitter Coupled Logic).

The frequency-division ratio data for the programmable frequency-divider 12 are set by the controller 17. In more particular, when a TV viewer operates desired channel keys provided in a key operation section 18, the channel data are fed to the controller 17. In response to the input channel data, the controller 17 reads out the preset frequency-division ratio data from a ROM (Read Only Memory) 20 and sets the data in the programmable frequency-divider 12. The programmable frequency-divider 12 divides the oscillation output of the local OSC 10 applied thereto via the prescaler 11. The phase difference between the frequency-divided output of the programmable frequency-divider 12 and the reference oscillation output from the Reference OSC 15 is detected by the phase detector 14, and an output corresponding to the phase difference is applied from the phase detector 14 to the LPF 13. The Local OSC 10 has its oscillation frequency controlled by the control signal applied from the LPF 13 so that the phase difference between the respective inputs to the phase detector 14 may be reduced to zero. As a result, a local oscillation frequency corresponding to the frequency-division ratio data of the selected channel is applied to the mixer 2, so that an intermediate frequency signal for the selected broadcasting station is applied to the IF AMP 3.

A picture carrier signal fed from the IF AMP 3 is applied to an automatic fine tuning (AFT) circuit 9 for the purpose of realizing the optimum receiving condition. The AFT circuit 9 includes an FM-detector (not shown). Assuming now that the received transmission frequency is equal to the regular frequency, that is, the offset is zero, then the frequency of the picture carrier signal input to the AFT circuit 9 also has the regular frequency value. The FM-detector within the AFT circuit 9 has S-curve characteristics having the center frequency located at the regular picture carrier signal frequency. Accordingly, in the case where a transmission frequency having zero offset has been received, the detector output of the FM-detector becomes a D.C. voltage Vo corresponding to the center frequency of the S-curve characteristic. The detector output of the FM-detector is applied to a comparator circuit 16 to derive digital signals representing a high level or a low level. If desired, the detector output from the FM-detector in the AFT circuit 9 could be applied via a D.C. amplifier to the comparator circuit 16. Moreover, in order to remove noise signals, the picture carrier signal fed from the IF AMP 3 could be applied via an amplifier associated with an amplitude limiter to the FM-detector in the AFT circuit 9.

The comparator circuit 16 comprises two comparators, that is, first and second comparators (not shown) to obtain data representing the direction in which the received transmission frequency deviates with respect to the regular frequency. The reference voltage applied to the both comparators is the D.C. voltage Vo corresponding to the center frequency in the S-curve characteristic of the FM-detector. However, this reference voltage is applied to an inverted input terminal of the first comparator, while is applied to non-inverted input terminal of the second comparator. If the transmission frequency having zero output is received and the FM-detector outputs the D.C. voltage Vo as described previously, then both the first and second comparators apply low level outputs to the controller 17. However, in the event that the received transmission frequency deviates in the direction of frequencies higher than the regular frequency (hereinafter, this condition will be called "positive offset"), the output of the FM-detector will be at a voltage higher than the D. C. voltage Vo, and accordingly, the output 16' of the first comparator will assume a high level and the output 16' of the second comparator will assume a low level. In the event that the received transmission frequency deviates in the direction of frequencies lower than the regular frequency (hereinafter, this condition will be called "negative offset"), the output of the FM-detector will be at a voltage lower than the D.C. voltage Vo, and accordingly, the output 16' of the first comparator will be at a low level and the output 16" of the second comparator will assume a high level.

The controller 17 judges the two signal levels fed from the comparator circuit 16 and varies the frequency-division ratio data in the programmable frequency-divider 12 accordingly. More particularly, if the two outputs from the comparator circuit 16 are both at the low level, this output state implies that the offset is zero, and hence variation of the frequency-division ratio data is not effected. If the outputs of the first and second comparators are at the high level and at the low level, respectively, positive offset is indicated, and so, the frequency-division ratio data are increased. The local oscillation frequency is thereby raised, and hence the positive offset can be compensated. During this process, when the frequency-division ratio data are increased, the local oscillation frequency is raised by a frequency increment determined by the reference frequency of the Reference OSC 15 and the fixed frequency-division ratio of the prescaler 11. Consequently, even when the transmission frequency having positive offset is received, the derived picture carrier signal frequency becomes closer to the regular frequency. At this moment, if the frequency of the picture carrier signal derived through the AFT operation is still higher than the regular frequency, the detector output from the FM-detector is a voltage higher than the D.C. voltage Vo. Therefore, the above-described operation for varying the frequency division ratio data is repeated. These operations can be repeated until the picture carrier signal having the regular frequency is obtained. When the AFT operation has been completed, the optimum receiving condition is realized. In the even that the output of the first comparator is at the low level and the output of the second comparator is at the high level, the operations differ from the above-described ones only in that the local oscillation frequency is lowered by varying the frequency-division ratio to a smaller value, and the other operations are identical to those described above. In this way, provided that the offset of the transmission frequency is within the frequency range where detection can be effected by the FM-detector, optimum tuning can be achieved through the above-mentioned operations.

However, in the case of the CATV, offset is as large as about ±1.3 MHz, while the offset which can be detected by the FM-detector is at most about ±1 MHz. Therefore, in such cases, the optimum tuning cannot be achieved by the mere addition of the AFT circuit 9. Hence, according to the present invention, the channel selector is additionally provided with a manual fine tuning function in order to achieve the optimum tuning by forcibly varying the frequency-division ratio data in response to an external signal. Also, the necessity of repeated manual fine tuning operation is eliminated.

In more particular, when the manual fine tuning keys provided in the manual operation section 18 are operated, the corresponding key data are fed to the controller 17. The controller 17 determines which key has been depressed, and depending upon this information, produces fine tuning data consisting of up/down data indicating whether the frequency-division ratio data are to be increased or decreased, and quantitative data indicating how much the frequency-division ratio data are to be varied. The frequency-division ratio data are varied according to the fine tuning data and are then set in the programmable frequency-divider 12 as renewed frequency-division ratio data. As a result, the local oscillation frequency is varied so as to compensate the offset, and thereby the optimum tuning can be achieved. The controller 17 stores the fine tuning data in a RAM (Random Access Momory) 19. This RAM 19 is allotted with addresses corresponding to all the channels of the CATV, which has especially large offsets. Hence, the fine tuning data are stored at the address of the RAM 19 corresponding to the channel for which the manual fine tuning has been affected.

It is assumed that a TV viewer has switched from a first (tuned) channel to another channel and then switched back to the first channel. At this moment, in response to the last switching of channels, the controller 17 reads out the frequency-division ratio data corresponding to the last selected channel from the ROM 20. However, the last selected channel has so large an offset that optimum tuning cannot be achieved only with the AFT operation. Therefore, the controller 17 also reads out the fine tuning data corresponding to that channel from the RAM 19. In the fine tuning data are included the up/down data indicating whether the frequency-division ratio data are to be increased or decreased and the quantitative data indicating the quantity of variation of the frequency-division ratio data. Accordingly, the controller varies the frequency-division ratio data read out of the ROM 20 according to the fine tuning data into renewed frequency-division ratio data for achieving optimum tuning, and sets the renewed data in the programmable frequency divider 12. Consequently, the local oscillation frequency becomes a frequency corresponding to the renewed frequency-division ratio data, irrespective of the frequency-division ratio data stored in the ROM 20. In other words, the offset can be compensated and the optimum receiving condition can be realized.

The above-described operation will be further explained with reference to the block diagram in FIG. 2 which illustrates a more detailed construction of the controller 17 in block form.

Key data obtained by key operation in the key operation section 18 are input to a key input detector 38. This key input detectors 38 judges what key in the key operation section 18 has been operated, and depending upon the results of this judgement the corresponding signals are respectively output. In the key operation section 18, as shown in FIG. 3, ten keys 0 to 9 for selecting a desired channel, manual fine tuning up and down keys FTU and FTD, and AFT key for AFT operation, and M/S key are provided. If the number of the channel to be selected is "18", the channel key of "1" is first pushed and then the channel key "8" is pushed. For selecting a channel having a number less than 10, it is necessary to push the "0" key, followed by pushing a key of the channel number. In the event that channel keys "1" and "8" have been pushed, the key input detector 38 applies channel data corresponding to these channel keys to a ROM controller 46. Then, the ROM controller 46 responds to the input channel data by reading out frequency-division ratio data stored in the ROM 20 at the address corresponding to the selected channel, i.e. the 18th channel, and setting this frequency-division ratio data in an up/down counter 42. The division ratio data are fed to the programmable frequency-divider 12, and thereby a predetermined local oscillation frequency can be obtained.

The controller 17 includes a level detector 48 for detecting two input levels applied from the comparator circuit 16. When the AFT key in the key operation section 18 is operated, the key input detector 38 activates the level detector 48. The two outputs 16' and 16" from the comparator circuit 16 would vary depending upon the offset condition of the received transmission frequency. Discrepancy between the levels of the respective outputs means that an offset is present. The activated level detector 18 detects such conditions and also detects the level condition of the two outputs, and depending upon the level condition, it either counts up or counts down the data in the up/down counter 42 as described previously. Sometimes, with only one of count-up or count-down operation, the optimum tuning cannot be achieved. Accordingly, the level detector 48 repeatedly detects the condition of the output signal levels from the comparator circuit 16 at a predetermined repetition cycle to successively vary the data in the up/down counter 42. These operations are repeated until both output signals of the comparator circuit 16 take the low level. When these operations have terminated, the local oscillation frequency would be the frequency adapted to compensate the offset of the transmission frequency.

It is to be noted that the channel data fed from the key input detector 38 are also applied to a RAM controller 44. This is for the purpose of reading out fine tuning data stored in the RAM 19 at an address corresponding to the selected channel, i.e., the 18th channel. The RAM controller 44 reads out fine tuning data corresponding to the selected channel and applies this data to the up/down counter 42. It is assumed that at this moment manual fine tuning has never been effected for the selected channel. That is, the fine tuning data which were stored in the RAM 19 and has been read out at this moment are in their initial condition. Accordingly, the frequency-division ratio data read out of the ROM 20 and set in the up/down counter 42 are transferred to the programmable frequency-divider 12 without being varied. As a result, the local oscillation frequency takes the value corresponding to the transferred frequency-division ratio data.

In the case where the transmission frequency of the selected channel has such a large offset that fine tuning by means of the AFT circuit 9 cannot be achieved, the picture image on the Braun tube 7 and the sound from the loudspeaker 5 would contain a considerable degree of noise. Hence, the TV viewer would operate manual fine tuning keys. As the manual fine tuning keys, there are provided an up-key and a down-key. Here, the terms "up" and "down" mean an increase and decrease, respectively, of the data set in the up/down counter 42. These keys are provided for dealing with both positive and negative offsets. However, a TV viewer can hardly judge whether the transmission frequency deviates with respect to the regular frequency in the direction of higher frequencies or in the direction of lower frequencies. Accordingly, at first he operates one of the manual fine tuning keys, for example, the manual fine tuning up-key. Then the key input detector 38 judges that the manual fine tuning up-key has been depressed. Since the operation of the up-key is to effect an increase of the data set in the up/down counter 42, the key input detector 38 applies an up-data signal to the up/down counter 42. The key input detector 38 applies a signal to a pulse generator 40 to obtain a pulse signal which serves to successively vary the data set in the up/down counter 42. In response to the signal applied from the key input detector 38, the pulse generator 40 generates a pulse signal. Hence, so long as the signal is applied from the key input detector 38 to the pulse generator 40, that is, during the period when the manual fine tuning key is depressed, a pulse signal having a predetermined pulse repetition cycle is generated by the pulse generator 40. This generated pulse signal is applied to the up/down counter 42 as a drive signal. Since the up/down counter 42 is set in a count-up operation mode by the up-signal signal fed from the key input detector 38, each time a pulse in the pulse signal is input to the up/down counter 42, its count value is increased by one. In other words, the frequency division ratio data corresponding to the selected channel which was read out of the ROM 20 are increased one by one. The increased frequency-division ratio data are transferred to the programmable frequency-divider 12 to renew the frequency-division ratio data set therein.

If the transmission frequency has a positive offset, the intermediate frequency obtained via the mixer 2 is shifted closer to the regular intermediate frequency by the above-mentioned operation of the manual fine tuning up-key. Accordingly, the condition of the picture image as well as the condition of the output sound is improved. However, in the case where the transmission frequency has a negative offset, the intermediate frequency at the output of the mixer 2 deviates farther from the regular intermediate frequency as a result of the above-described operation of the up-key, and consequently, the picture and sound output conditions are further deteriorated. In such cases, the TV viewer would notice the deterioration of the tuning condition, and hence he would know that now it is only necessary to operate the manual fine tuning down-key.

In response to operation of the manual fine tuning down-key, similarly to the above-described series of operations, the key input detector 38 applies a down-data signal to the up/down counter 42 to set it in a count-down operation mode, the pulse generator 40 generates a pulse signal, and as a result, the up/down counter 42 decreases its count value, that is, decreases the frequency-division ratio data. Owing to the decreased frequency-division ratio data, the local oscillation frequency is lowered, and so, the intermediate frequency derived at the output of the mixer 2 comes closer to the regular intermediate frequency. The TV viewer carries out the above-mentioned manual fine tuning operations while watching the picture image condition, and stops the key operation at the optimum tuning condition. Through such manual fine tuning operations, the receiving condition of the channel selector is fairly improved or is brought to the optimum condition. If it is desired to realize the optimum receiving condition, it is only necessary to also operate the AFT key because the intermediate frequency derived after the manual fine tuning operation falls in the frequency range where the intermediate frequency can be detected by the FM-detector in the AFT circuit. Here it is to be noted that when the pulse repetition period of the pulse signal generated by the pulse generator 40 is considerably short, the variation of the local oscillation frequency is so fast that the manual fine tuning key operation in the key operation section 18 cannot follow the above-described fine-tuning process in the circuit. Therefore, it is necessary that the pulse generator 40 generate a pulse signal having a sufficiently large pulse repetition period. In one preferred embodiment of the present invention, provision is made such that a pulse signal having a pulse repetition period of 125 msec may be generated by the pulse generator 40, taking into consideration the manual operation speed of the keys and the fine tuning speed in the circuit. The pulse signal having such a pulse repetition period is generated when the signal fed from the key input detector 38 is continuously applied to the pulse generator 40, that is, when the manual key operation is effected continuously. Whereas, when the manual fine tuning key is impulsively operated only once, only a single pulse is generated by the pulse generator 40. Such provision was made taking into consideration a small offset condition. That is, if the offset of the transmission frequency is small, in some cases the optimum tuning can be achieved by applying only one up-pulse or down-pulse to the up/down counter 42. Of course, if the offset is large, application of a plurality of pulses to the up/down counter 42 is necessary. Moreover, since the AFT circuit 9 is provided, even in the case of a considerably large offset, if the intermediate frequency is brought into the frequency range where the tuning operation by means of the AFT circuit 9 can be achieved by applying only a few pulses to the up/down counter 42, then the subsequent fine tuning can be achieved by means of the AFT circuit 9.

The outputs of the key input detector 38 and the pulse generator 40 are also input to the RAM controller 44. This is done for the purpose of holding the fine tuning data which are necessary to achieve the optimum tuning and thereby eliminating the necessity of repeated manual fine tuning operations. More particularly, in the case where manual fine tuning operations have been effected after the operation of the channel key, the up-data or down-data as well as the quantitative data representing the quantity of variation of the frequency-division ratio data derived during the manual fine tuning operation are transferred to the RAM controller 44. The transferred up-data or down-data and quantitative data are stored in the RAM 19 at the address corresponding to the selected channel, i.e. the 18th channel. For instance, a memory area corresponding to one address is formed of five bits, the transferred up- or down-data are stored in the most-significant bit position, and the quantitative data are stored in the less-significant four bit positions. The up- or down-data can be made to correspond to logic 1 or logic 0. Since the quantitative data varies depending upon the offset condition, each time a pulse in the pulse signal is generated from the pulse generator 40, the respective pulses are successively stored and the entire stored pulses form the quantitative data. As described previously, upon manual fine tuning the up-key and down-key may be equally possibly operated depending upon the offset condition, and therefore, the successively stored pulses carry out count-up or count-down for the less-significant four bits in the memory area in similar manner to the count-up or count-down carried out in the up/down counter 42.

Alternatively, by changing the operated key among the manual fine tuning keys, fine tuning data may be initialized, and then new fine tuning data are stored in the RAM at the given address. Thus, the fine tuning data corresponding to the selected channel can be held in the above-described manner.

When the TV viewer selects another channel by operating another channel key in the key operation section 18, the key input detector 38 applies the channel data to the ROM controller 46. The ROM controller 46 reads out the frequency-division ratio data corresponding to the applied channel data from the ROM 20, and sets this data in the up/down counter 42, and as a result, a local oscillation frequency corresponding to the frequency-division ratio data is derived. At this moment, if the receiving condition of the channel selector is deteriorated due to the fact that the transmission frequency of the selected channel has a large offset, the optimum tuning is achieved by operating the above-described manual fine tuning keys, and the fine tuning data are stored in the RAM 19 at the address corresponding to the selected channel.

Subsequently, if the TV viewer again selects the previously selected channel by operating the corresponding channel keys, i.e. channel keys "1" and "8" in the key operation section 18, then the ROM controller 46 reads out the frequency-division ratio data corresponding to the selected channel "18" from the ROM 20 and sets the read data in the up/down counter 42. At the same time, the RAM controller 44 reads out the data stored in the RAM 19 at the address corresponding to the selected channel "18". At this address are stored the fine tuning data derived during the manual fine tuning operation upon the previous selection of the same channel. The RAM controller 44 applies this fine tuning data to the up/down counter 42. More particularly, the up- or down-data stored at the most-significant bit position of the RAM are applied to the up/down terminal of the up/down counter 42, and the quantitative data stored at the less significant four bit positions of the RAM are applied to the data input terminals of the up/down counter 42. The up/down counter 42 is set in a count-up or count-down mode depending upon the up- or down-data applied thereto, and it counts up or counts down the frequency division ratio data which were read out of the ROM 20 and set therein, according to the quantitative data applied thereto from the RAM controller 44. The thus obtained new frequency-division ratio data are taken into the programmable frequency divider 12. Consequently, the frequency-division ratio data obtained in response to the channel selection at this time would coincide with the frequency-division ratio data obtained through manual fine tuning operations in response to the previous channel selection. In other words, the local oscillation frequency adapted for realizing the optimum tuning condition can be derived. Accordingly, upon channel selection by simply pushing the keys "1" and "8", the optimum tuning can be effected without repeating the manual fine tuning operations.

As described previously, the channels which necessitate manual fine tuning operations are CATV channels in which transmission is effected through a cable. The CATV generally involves 23 channels consisting of channels A to W. Therefore, the RAM 19 has 23 addresses for storing the 23 fine tuning data so as to deal with all 23 channels of the CATV. The channel numbers corresponding to CATV A to W are "14" to "36". Such numbers "14" to "16" also correspond to UHF channels. Therefore, a receiving band change key (a mid band/super-band switch-over key M/S) for selecting the CATV band or the UHF band is provided in the key operation section 18. It is to be noted that in the case of the channel frequencies transmitted in a wireless manner as in the case VHF and UHF channels, the offsets of the transmission frequencies are very small or almost zero. Accordingly, addresses for storing the fine tuning data corresponding to the VHF and UHF broadcasts are unnecessary. Of course, it is not objectionable to provide such addresses. Furthermore, in some cases, the VHF broadcasting wave is also transmitted through a cable. In such cases, the VHF broadcast could involve a transmission frequency having a large offset. Accordingly, for such VHF broadcasts employing cable transmission, it is desirable to provide addresses for holding the corresponding fine tuning data.

The fine tuning data to be held are stored in the RAM 19. Therefore, if the power supply for the TV set is switched off, the memory contents in the RAM may possibly be destroyed. In order to deal with this problem, a back-up power supply could be provided for holding the stored fine tuning data. While the change of the frequency-division ratio data was effected by means of the up/down counter 42 in the above-described embodiment, the frequency-division ratio data stored in the ROM 20 and the fine tuning data stored in the RAM 19 could be applied to an adder or a subtractor depending upon the up-down signal to derive renewed frequency-division ratio data. Moreover, addition or subtraction processing according to a programmed system employing a CPU, could be used for the same purpose. The pulse generator 40 having the above-mentioned operation capabilities can be easily realized by means of an oscillation source and logic circuits in combination. Needless to say, the present invention is applicable to other channel selectors such as those in radio receivers or the like.

As described in detail above, according to the present invention there is provided a channel selector in which repeated manual fine tuning operations for the same channel are unnecessary.

What is claimed is:

1. A receiver comprising a first set of keys, a second set of keys, means coupled to said first set of keys for producing an address signal corresponding to a channel number designated by operation of at least one key of said first set, a first memory device storing frequency-division ratio data for each designatable channel number, a second memory device storing fine tuning data for varying said frequency-division ratio data, means coupled to said producing means and said first and second memory devices for applying the address signal produced by said producing means to said first memory device and at the same time to said second memory device to read out both said frequency-division ratio data and said fine tuning data corresponding to the designated channel number from said first and second memory devices, a frequency divider, means coupled to said first and second memory devices for generating a new frequency-division ratio data to be set into said frequency divider in response to said frequency-division ratio data and said fine tuning data corresponding to said designated channel number, means responsive to said new frequency-division ratio data set into said frequency divider for providing a local oscillation signal, and means responsive to operation of at least one of said second set of keys for storing a fine tuning data in said second memory device.

2. A receiver as claimed in claim 1, wherein said first and second memory devices are a read only memory and a read/write memory, respectively, and said generating means comprises an up/down counter, said up/down counter generating said new frequency-division ratio data by counting said frequency-division ratio data up or down in accordance with said fine tuning data.

3. A receiver as claimed in claim 2, wherein said applying means comprises a first controller controlling said read only memory and a second controller controlling said read/write memory, said address signal being supplied to both first and second controllers, said frequency-division ratio data read out of said read only memory being supplied to said generating means through said first controller, and said fine tuning data read out of said read write memory being supplied to said generating means through said second controller.

4. A receiver claimed in claim 3, wherein said producing means has a key input detector detecting which key of said first set of keys is depressed, said input detector further detecting which key of said second set of keys is depressed.

5. A receiver claimed in claim 1, wherein said first set of keys are used to directly designate channel numbers.

6. A receiver comprising a first key section for directly designating a channel number, a second key section for carrying out manual fine tuning operation, a key input detector generating a first detection signal when said first key section is operated and a second detection signal when said second key section is operated, a read only memory storing a plurality of frequency-division ratio data for each designatable channel number, a first controller reading out a predetermined frequency-division ratio data corresponding to a designated channel number by said first key section from said read only memory in response to said first detection signal, means responsive to said second detection signal for producing manual fine tuning data for varying said predetermined frequency-division ratio data, a read/write memory, a second controller enabling said read/write memory to memorize said manual fine tuning data therein in response to said second detection signal, and reading out said manual fine tuning data corresponding to said designated channel number from said read/write memory in response to said first detection signal, means responsive to said predetermined frequency-division ratio data and said manual fine tuning data for generating a new frequency-division ratio data for said designated channel number and means responsive to said new frequency-division ratio data for providing a local oscillation signal, whereby a second manual fine tuning operation for said designated channel number is unnecessary.

7. A receiver as claimed in claim 6, wherein said first detection signal is supplied simultaneously to said first and second controllers.

8. A receiver comprising a key operation section including a first set of keys for directly designating a plurality of channel numbers and a second set of keys having at leat one key for carrying out a manual fine tuning function, means responsive to operation of said first set of keys for obtaining predetermined frequency-division ratio data corresponding to a desired channel number designated by operation of said first set of keys, means responsive to operation of said at least one key in said second set of keys for producing manual fine tuning data for varying said predetermined frequency-division ratio data, means responsive to operation of said at least one key in said second set of keys for memorizing said manual fine tuning data, means for reading out said manual fine tuning data from said memorizing means, means responsive to said predetermined frequency-division ratio data from said obtaining means and said manual fine tuning data through said reading out means for generating new frequency-division ratio data, means responsive to operation of at least one key in said first set of keys used to directly designate said desired channel number for activating said reading out means and said generating means in order to generate said new frequency-division ratio data, a frequency divider receiving said new frequency-division ratio data, and means responsive to said new frequency-division ratio data for providing a local oscillation signal.

9. A receiver as claimed in claim 8, wherein said generating means comprises an up/down counter, said predetermined frequency-division ratio data being set into said up/down counter, said up/down counter counting said predetermined frequency-division ratio data up or down in response to said manual fine tuning data, thereby generating said new frequency-division ratio data.

* * * * *

UNITED STATES PATENT AND TRADEMARK OFFICE
CERTIFICATE OF CORRECTION

PATENT NO. : 4,408,349

DATED : October 4, 1983

INVENTOR(S) : Tatsuo Yukawa

It is certified that error appears in the above—identified patent and that said Letters Patent is hereby corrected as shown below:

Column 2, line 38, after "there" insert --are--.

Column 3, line 16, after "effected" insert --was--.

Column 3, line 66, after "been" insert --priorly--.

Column 3, line 67, after "received" delete "in".

Column 3, line 68, before "becomes" delete "the prior art,".

Column 4, line 27, after "mixer" (second occurrence) change "12" to --2--.

Column 5, line 62, after "while" insert --it--.

Column 6, line 46, before "that" change "even" to --event--.

Column 6, line 58, before "CATV" delete "the".

Column 6, line 58, before "offset" insert --the--.

UNITED STATES PATENT AND TRADEMARK OFFICE
CERTIFICATE OF CORRECTION

PATENT NO. : 4,408,349

DATED : October 4, 1983

INVENTOR(S) : Tatsuo Yukawa

It is certified that error appears in the above-identified patent and that said Letters Patent is hereby corrected as shown below:

Column 7, line 66, after "by" delete "pushing a" insert --the--.

Column 10, line 67, after "in" insert --a--.

Column 11, line 68, after "CATV" insert --channels--.

Signed and Sealed this

Twenty-eighth Day of August 1984

[SEAL]

*Attest:*

GERALD J. MOSSINGHOFF

*Attesting Officer*   *Commissioner of Patents and Trademarks*